United States Patent
Succi et al.

(10) Patent No.: US 6,168,645 B1
(45) Date of Patent: Jan. 2, 2001

(54) SAFETY SYSTEM FOR GAS PURIFIER

(75) Inventors: Marco Succi, Milan; Giorgio Vergani, Morza, both of (IT); D'Arcy H. Lorimer, Pismo Beach, CA (US)

(73) Assignee: SAES Getters S.p.A. (IT)

( * ) Notice: Under 35 U.S.C. 154(b), the term of this patent shall be extended for 0 days.

(21) Appl. No.: 09/174,055

(22) Filed: Oct. 15, 1998

Related U.S. Application Data

(60) Provisional application No. 60/062,043, filed on Oct. 15, 1997.

(51) Int. Cl.[7] ................................................. B01D 53/04
(52) U.S. Cl. .................... 95/8; 95/14; 95/90; 95/116; 96/111; 96/112; 96/117; 96/419; 96/420
(58) Field of Search ................ 95/8, 11, 14, 90, 95/116; 96/108, 111, 112, 117, 130–132, 419, 420, 424

(56) References Cited

U.S. PATENT DOCUMENTS

| | | | | |
|---|---|---|---|---|
| 3,258,896 | * | 7/1966 | Müller | 95/8 |
| 3,536,522 | | 10/1970 | Cecil et al. | 117/106 |
| 3,919,765 | | 11/1975 | Schloetterer | 29/571 |
| 4,095,965 | * | 6/1978 | Heumann et al. | 96/419 X |
| 4,197,098 | * | 4/1980 | Stiehl et al. | 96/131 X |
| 4,468,236 | * | 8/1984 | Bauer | 96/112 X |
| 4,816,043 | * | 3/1989 | Harrison | 96/112 |
| 4,983,190 | * | 1/1991 | Verrando et al. | 95/11 |
| 5,047,073 | * | 9/1991 | Stetter et al. | 95/8 |
| 5,172,066 | | 12/1992 | Succi et al. | 324/693 |
| 5,238,469 | * | 8/1993 | Briesacher et al. | 96/108 X |
| 5,328,872 | | 7/1994 | Manocha et al. | 437/235 |
| 5,334,237 | | 8/1994 | Lorimer | 95/25 |
| 5,393,686 | | 2/1995 | Yeh et al. | 437/45 |
| 5,474,594 | * | 12/1995 | Khelifa et al. | 95/14 |
| 5,524,433 | | 6/1996 | Adamezyk et al. | 60/276 |
| 5,855,118 | | 1/1999 | Lorimer | 62/55.5 |
| 5,882,727 | * | 3/1999 | Corazza et al. | 427/229 |

FOREIGN PATENT DOCUMENTS

| 0 438 036 A2 | 12/1990 | (EP) . |
| 2 177 079A | 1/1987 | (GB) . |
| 2 177 080A | 1/1987 | (GB) . |

* cited by examiner

Primary Examiner—Robert H. Spitzer
(74) Attorney, Agent, or Firm—Hickman, Coleman & Hughes, LLP

(57) ABSTRACT

A gas purification system includes a gas purification unit and one or more safety devices. The gas purification unit includes an enclosure containing a purification material that exhibits an exothermic reaction when exposed to certain gas contaminants. The gas purification unit also has an inlet coupled to an unpurified gas inlet line and an outlet coupled to a purified gas outlet line. A safety device can be coupled either to the unpurified gas input line or the purified output line, or both, and develops an alarm signal when gas contaminants exceed a given concentration level for a period of time.

19 Claims, 9 Drawing Sheets

SAFETY SYSTEM FOR GAS PURIFIER

CROSS REFERENCE TO RELATED APPLICATIONS

This application claims the benefit of U.S. Provisional Patent Application No. 60/062,043, filed on Oct. 15, 1997, entitled SAFETY SYSTEM FOR GAS PURIFIER by inventors Marco Succi, Giorgio Vergani and D'Arcy H. Lorimer, the disclosure of which is incorporated herein by reference for all purposes.

This application is related to U.S. Pat. No. 6,068,685, filed Oct. 15, 1997, entitled SEMICONDUCTOR MANUFACTURING SYSTEM WITH GETTER SAFETY DEVICE by inventors D'Arcy H. Lorimer and Charles H. Applegarth and U.S. patent application Ser. No. 09/172,972, filed Oct. 14, 1998 that claims priority from U.S. Provisional Patent Application Serial No. 60/062,122, filed Oct. 15, 1997, entitled SEMICONDUCTOR MANUFACTURING SYSTEM WITH GETTER SAFETY DEVICE by inventors D'Arcy H. Lorimer and Charles H. Applegarth, the disclosures of which are incorporated herein by reference for all purposes.

BACKGROUND OF THE INVENTION

The present invention relates generally to gas purifiers and, more particularly, to a gas purifier having a safety system for cutting off gas flow to and removing impure gas from a gas purifier.

Gas purifiers working on sorption of impurities mainly belong to two categories: getter-based purifiers and catalyst-based purifiers. The difference between the two types is that getter-based purifiers operate using the chemisorption principle, that is, non-reversible sorption, so that once the purifier is exhausted it must be replaced; while catalyst-based purifiers operate using the physisorption principle, so that these purifiers may be regenerated by thermal or chemical treatment once exhausted. Catalyst-based purifiers may be desirable for their regeneration characteristic, but the range of gases which may be purified is narrow compared to the possibilities of getter-based purifiers. Both kinds of purifiers are meant to remove traces of reactive impurities from an inert (to the purifier chemical) gas. Both types of purifiers may also be ruined in case a wrong gas or a high concentration of a particular gas is fed into the purifier, or in case an atmospheric gas gets in due to failure of the gas line.

Getter-based gas purifiers produce extremely pure gases, e.g., argon, helium, hydrogen, and nitrogen, for use in applications such as semiconductor processing. These gas purifiers, which are sometimes referred to as "getter columns," typically include a bed of getter material which purifies gas flowing therethrough by adsorbing impurities therefrom.

Getter-based gas purifiers are potentially hazardous because the getter material contained therein may be highly reactive with high concentrations of certain impurities. For example, a high concentration of an impurity gas, such as oxygen, may be accidentally introduced into a gas purifier containing a known zirconium-based getter material, and an exothermic reaction results. A "high" concentration of impurity gas (or "reactive gas"), as referred to herein, means a quantity of gas per unit time such that the heat generated by the exothermic reaction with the getter has not time to be dissipated (by conduction, or by the flowing gas itself) and accumulates with a steep rising of temperature. The critical amount of gas depends on the nature of the gas (i.e., the higher the heat of reaction with the getter, the lower the critical amount of gas), on the concentration of the reactive species in the overall gas composition, and on the gas flow velocity. In general, oxygen concentrations of more than 1–2% may be critical, whereas it has been observed that nitrogen concentrations below 5–6% pose no problem to the purifier, due to nitrogen's lower reactivity.

The steep temperature rise resulting from the exothermic reaction may cause melting of the containment wall of the purifier. The containment wall, which is typically formed of stainless steel, may melt at temperatures as low as about 1,000C. because the getter material contacting the containment wall reacts therewith and forms a eutectic composition. If melting of the containment wall results in the formation of a hole therein, then breach of containment of the getter material occurs, which is potentially catastrophic. The destruction of the getter purifier and consequent processing interruptions would result from such a reaction.

Catalyst-based gas purifiers may also be damaged from high concentrations of reactive gases. The most widely known and used catalyst-based purifiers are those based on zeolites-supported nickel for purification of nitrogen. In case of contact with atmospheric gases, the zeolite-nickel bed can heat up to temperature values of about 600–800° C., that may lead to sintering of particles and heavy formation of nickel oxide, with the result that the purifier is no longer regenerable.

In view of the foregoing, there is a need for a safety device for gas purifiers which protects against breach of containment of the purifier material in the event high concentrations of impurity gases are introduced therein. To ensure that the gas purifier is always protected against breach of containment of the purifier material, the safety device must be extremely reliable. In other words, the safety device preferably should not include complex instrumentation which, in addition to being expensive, may either malfunction or generate false alarms which are disruptive and costly to a semiconductor fabrication facility.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE PREFERRED EMBODIMENTS

The preferred embodiments of the present invention will now be described in tail with reference to the accompanying drawings.

Safety Systems

Figure 1:
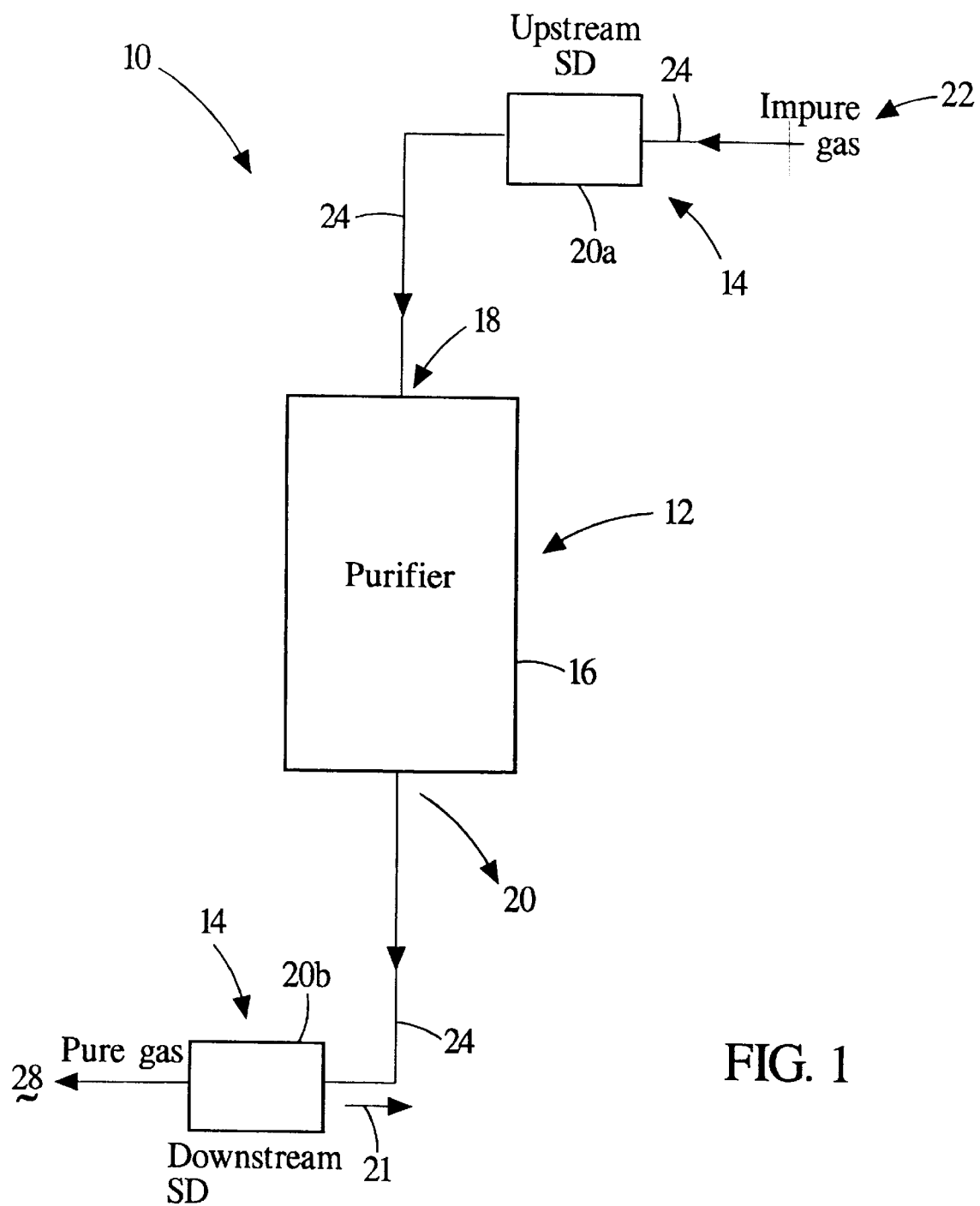
FIG. 1 is a block diagram of a first embodiment of a gas purifier and safety system of the present invention.

FIG. 1 shows a purifier system 10 including a gas purifier 12 and a safety system 14 formed in accordance with a first embodiment of the present invention. Gas purifier 12 includes housing 16 having an inlet 18 and an outlet 20. Impure gas flows from a source 22, through gas pipeline 24, through inlet 18, and into gas purifier 12. After the gas is purified, the gas flows through outlet 20, back into gas pipeline 24, and into the desired environment 28 such as a semiconductor processing chamber. Gas purifier 12 may be a getter-based purifier or a catalyst-based purifier. Particular focus is placed on getter-based materials and purifiers herein, but the safety system principles of the present invention may also be adapted to other purifiers, such as those purifiers using base metals to remove oxidizing species from a gas e.g., a zeolite-nickel bed in a catalyst-based purifier may be provided with safety devices optimized for use with the appropriate gas for equivalent results.

The implementation of getter purifiers such as included in gas purifier 12 are well known to those skilled in the art. Housing 16 of gas purifier 12 may be made from any suitable material having sufficient strength and high temperature resistance, e.g., metallic materials. In a preferred embodiment, housing 16 is made of stainless steel. As is well known to those skilled in the art, the interior of gas purifier 12 includes a containment wall and a getter pump or bed (not shown) to facilitate gas purification. When gas to be purified flows through the getter bed, the getter material forming the bed sorbs impurities from the gas and thereby purifies the gas. Commercially available getter materials appropriate for the gas being purified are suitable for forming the getter bed. The getter material forming getter bed may be in the form of pellets, pills, powder, granules, or other suitable shape. By way of example, preferred getter materials for purifying noble gases such as Ar and He are sold by SAES Getters S.p.A. of Milan, Italy, under the trade designations St 707™ and St 101®. The St 707™ alloy has a composition of 70 wt % Zr, 24.6 wt % V, and 5.4 wt % Fe. The St 101® alloy has a composition of 84 wt % Zr and 16 wt % Al. A preferred getter material for purifying $N_2$ is sold by SAES Getters S.p.A. of Milan, Italy, under the trade designation St 198™. The St 198™ getter material is a $Zr_2Fe$ compound.

The safety system 14 of the present invention is provided to protect the gas purifier 12 from accidental intake of high amounts of impurity gases that are reactive toward the getter materials, which can produce a violent reaction leading to destruction of the purifier and safety and environmental hazards. The safety system of the present invention preferably includes safety devices 20a and 20b that sense the presence of the high amounts of impure reactive gases. The safety devices preferably produce an electrical danger signal in reaction to sensing the impure gases, and a control unit can receive the danger signal and controls valves to protect the gas purifier, as described below. In this first embodiment, the safety device 20a is placed on the gas pipeline 24 such that all gas flowing through the pipeline moves through the safety device 20a.

An upstream safety device 20a is preferably placed upstream in the gas flow through the gas purifier 12. As opposed to the downstream safety device 20b (described below), the upstream safety device generally detects and reacts with any impure gas flowing into the pipeline 24 in the normal direction of flow; thus, the upstream safety device 20a must be capable of withstanding aging over time (as explained below). Thus, the upstream safety device should have a reactivity level based on a balance between the need of a minimum life requirement in normal operation, and a fast reactivity in an emergency. For example, a typical minimum life requirement can be about 6 months. In contrast, the downstream safety device 20b can have a high reactivity since it is more of a "one-shot" device, as explained below. Preferred implementations of safety device 20a are described in detail below. The operation of the electrical signal and control unit are described with reference to FIG. 4.

Downstream safety device 20b is placed downstream of the gas flow passing through gas purifier 12. Safety device 20b is provided to protect the gas purifier 12 from the possibility of a backflow of gas back into the gas purifier 12, in the direction of arrow 21. For example, the flow of impure gas in pipeline 24 into inlet 18 of purifier 12 might be stopped due to the system going down, processing requirements, etc. In such a case, the purifier 12 may have an internal pressure lower than the pressure downstream, thus drawing back downstream gas from the atmosphere or pipeline. This is known as "backdiffusion." "Backflow" is a similar condition where the pressure upstream from the purifier is lower than the pressure downstream. Both of these types of phenomena are referred to as "backflow" herein. In other situations, errors in operation of the getter purifier may occur that cause impure gases to flow in the direction of arrow 21. Since the backflow event may only occur in isolated circumstances, the downstream safety device 20b can be a one-shot device that may include a highly reactive material to sense a high quantity of impure gas in a short amount of time. Preferred implementations of safety device 20b are described in detail below.

One advantage to placing the safety devices 20a and 20b on the main gas pipeline 24 is that there is no waste of gas by routing a portion of the gas to the devices separate from the main gas line. However, one disadvantage of this configuration is that the pipe section is reduced in length, which can particularly be a problem when high flow rates are needed. In addition, replacing a device 20a or 20b interrupts the main line 24 and purifier operation.

The safety system 14 and/or devices 20a and 20b of the present invention can also be used in connection with other safety systems or devices, such as, for example, the safety devices and safety systems described in co-pending U.S. patent applications Ser. No. 08/950,929, by Lorimer et al., entitled, "Semiconductor Manufacturing System with Getter Safety Device", Attorney Docket No. SAS1P432, filed Oct. 15, 1997; and Ser. No. 60/062,122, by Lorimer et al., entitled, "Semiconductor Manufacturing System with Getter Safety Device", Attorney Docket No. SAS1P436+, filed Oct. 15, 1997, both of which are incorporated by reference herein.

Figure 2:
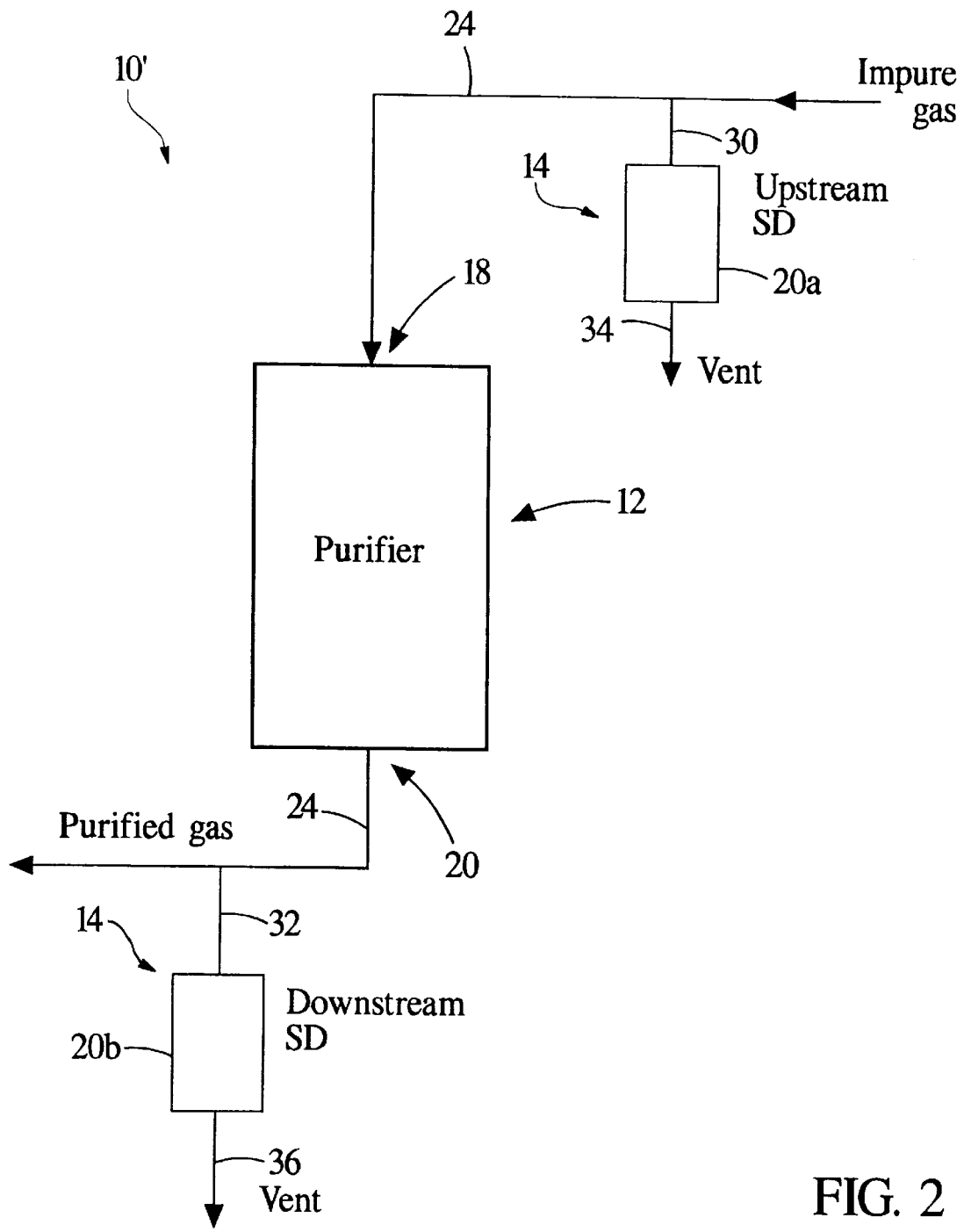
FIG. 2 is a block diagram of a second embodiment of a gas purifier and safety system of the present invention.

FIG. 2 shows a second embodiment 10' of the purifier system of the present invention, where system 10' includes a getter gas purifier 12 and safety system 14 formed in accordance with a second embodiment of the present invention. Gas purifier 12 and pipeline 24 are similar to the purifier described with reference to FIG. 1. The safety devices 20a and 20b are also similar to those described above and are described in detail with reference to FIGS. 7–11.

System 10' includes system devices 20a and 20b which are provided on derived pipelines that branch from the main pipeline 24. For example, upstream system device 20a is connected to the main pipeline 24 by branch pipeline 30, while downstream system device 20b is connected to the main pipeline 24 by branch pipeline 32. In addition, the safety devices 20a and 20b have vents through which to release the gases passing therethrough to the atmosphere, where system device 20a includes vent 34 and system device 20b includes vent 36.

In this configuration, a portion of the gas flowing through main pipeline 24 is routed through the branch pipelines and through the system devices 20a and 20b to the atmosphere. Thus, a disadvantage is that this portion of the gas is lost to the system. Typically, a fraction of about 1/100–1/1000 of the gas entering the system is lost in this way. For example, typical purifiers have flows between 5–50 $m^3$/hr, which is about 85–850 liters/min. With such a flow, about 0.8–0.9 liters of gas per minute are passed through both system devices and lost through venting. However, advantages of the system include an easier construction since the number of joints and weldings on the gas line are minimized, thus reducing these possible sources of contamination. In addition, a system device 20a or 20b may be replaced without interrupting the purifying process, unlike the embodiment of FIG. 1. For these reasons, the system 10' is the preferred embodiment disclosed herein.

Figure 3:
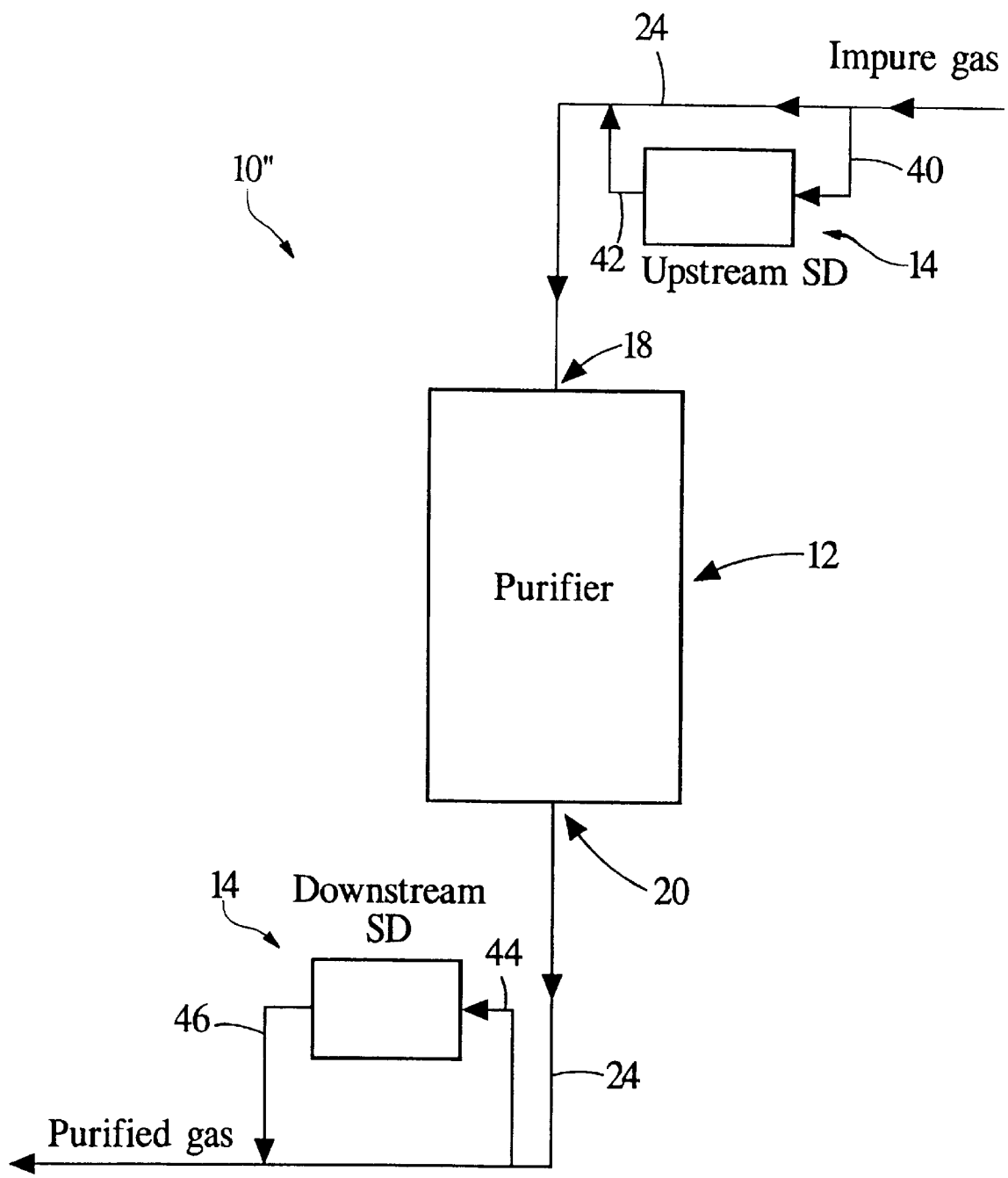
FIG. 3 is a block diagram of a third embodiment of a gas purifier and safety system of the present invention.

FIG. 3 shows a third embodiment 10" of the purifier system of the present invention, where system 10" includes a getter gas purifier 12 and safety system 14 formed in accordance with a third embodiment of the present invention. Gas purifier 12 and pipeline 24 are similar to the purifier described with reference to FIG. 1. The safety devices 20a and 20b are also similar to those described above and are described in detail with reference to FIGS. 7–11.

System 10" includes system devices 20a and 20b which are provided in a parallel configuration with respect to the main pipeline 24. Thus, system device 20a includes a branch pipeline 40 which is routed from the main pipeline to the input of the system device, and a branch pipeline 42 which is routed from the output of the system device back to the main pipeline. This system therefore does not waste or lose any gas to the atmosphere, since the gas is brought back into the main pipeline after passing through the system device. System device 20b is similarly provided with an input pipeline 44 and an output pipeline 46. In some embodiments, a flow control device can be provided on the pipeline 24 between the input and output junctions to the safety device 20a (and 20b) to provide the correct pressure to allow a desired amount of gas to be diverted to the safety device.

Disadvantages of this embodiment include a complex construction and possibility of additional contamination, since branch pipelines must be attached to the main pipeline at two places for each safety device instead of just one as in the embodiment of FIG. 2. In addition, the parallel configuration may create an undesirable pressure drop in the pipeline.

It should be noted that the configurations of the three embodiments shown above can be mixed together in a single safety system 14. Thus, it is possible to have a serial configuration of FIG. 1 for the upstream system device 20a, and a "tee" configuration of FIG. 2 for the downstream system device 20b within a single system 14.

Figure 4:
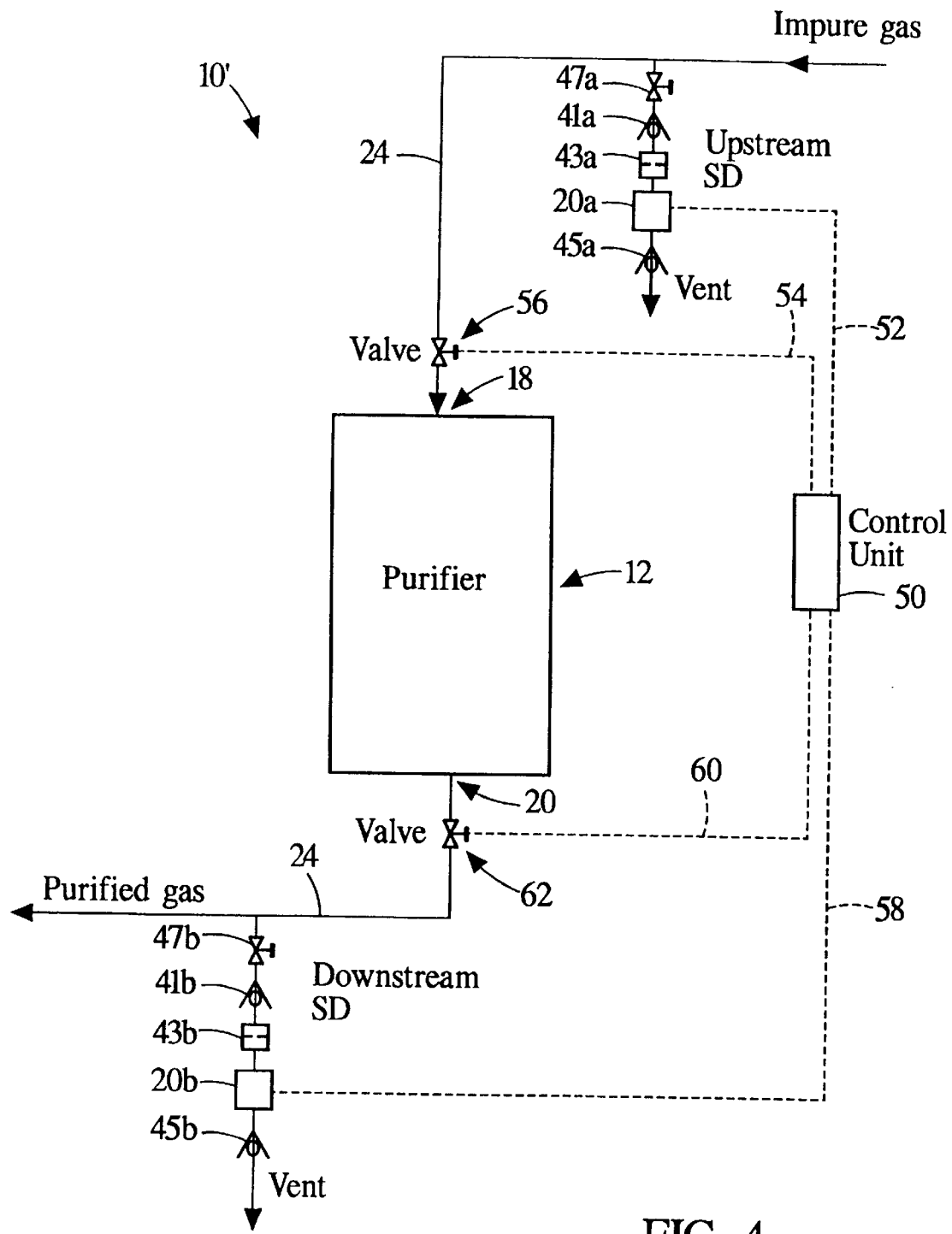
FIG. 4 is a block diagram of the first embodiment of the gas purifier and safety system of FIG. 1 including a control unit of the present invention.

FIG. 4 is a block diagram showing the purifier system embodiment 10' of FIG. 2 including a control unit of the present invention. The control unit can also be used in the other purifier system embodiments disclosed herein.

Control unit 50 is provided to control the emergency procedures of protecting the gas purifier 12 when a high amount of a reactive gas is detected by system device 20a or 20b. In this embodiment, an alarm signal is sent from system device 20a on line 52 to control unit 50 when the threshold of high level reactive gases is detected by the system device 20a. In response, the control unit 50 sends out a close signal via line 54 to control valve 56. The control valve 56 is positioned before the inlet 18 on main pipeline 24, and is responsive to the close signal from the control unit to close and prevent any gas from entering purifier 12. The control unit 50 can similarly provide an open signal to valve 56 via line 54 to cause the valve to open and allow gases to pass into the purifier 12. System device 20b similarly can output a danger signal on line 58 to control unit 50 when a high amount of reactive gas is sensed in a backflow situation, and the control unit can output an open or close signal on line 60 to valve 62 which is positioned after outlet 20 on main pipeline 24. The valve 62 opens or closes the main pipeline 24 as appropriate according to the signal from the control unit. Thus, in case of a reactive gas emergency, the control unit 50 closes the valve 56 or 62 corresponding to the emergency zone. In the preferred embodiment, unit 50 closes both valves 56 and 62 in case of an emergency regardless of the specific emergency zone. This can prevent any possible contamination in the non-emergency zone of the purifier caused by pressure differential and gas concentration gradients resulting from closure of just one valve.

The control unit 50 can be implemented in many different ways; for example, discrete logic components, a microprocessor, and/or software can control the valve operation and signal I/O, and/or a mixture of software and hardware can be provided to implement the functionality of the control unit. Methods and devices for controlling such signals are well known to those skilled in the art.

FIG. 4 also shows other components that can be optionally used in the "Tee" configuration of safety devices 20a and 20b of FIGS. 2, 4 and/or 5. Check valves 41a and 45a can be provided surrounding the safety device 20a to prevent gases from flowing into the pipeline from the vent. A flow control device or orifice 43a can be positioned before the safety device 20a to fix the flow rate of gas through the safety device. Another valve 47a can be provided to control access to the safety device. Similar valves 47b, 41b, and 45b and flow control device 43b can be provided for safety device 20b.

Figure 5:
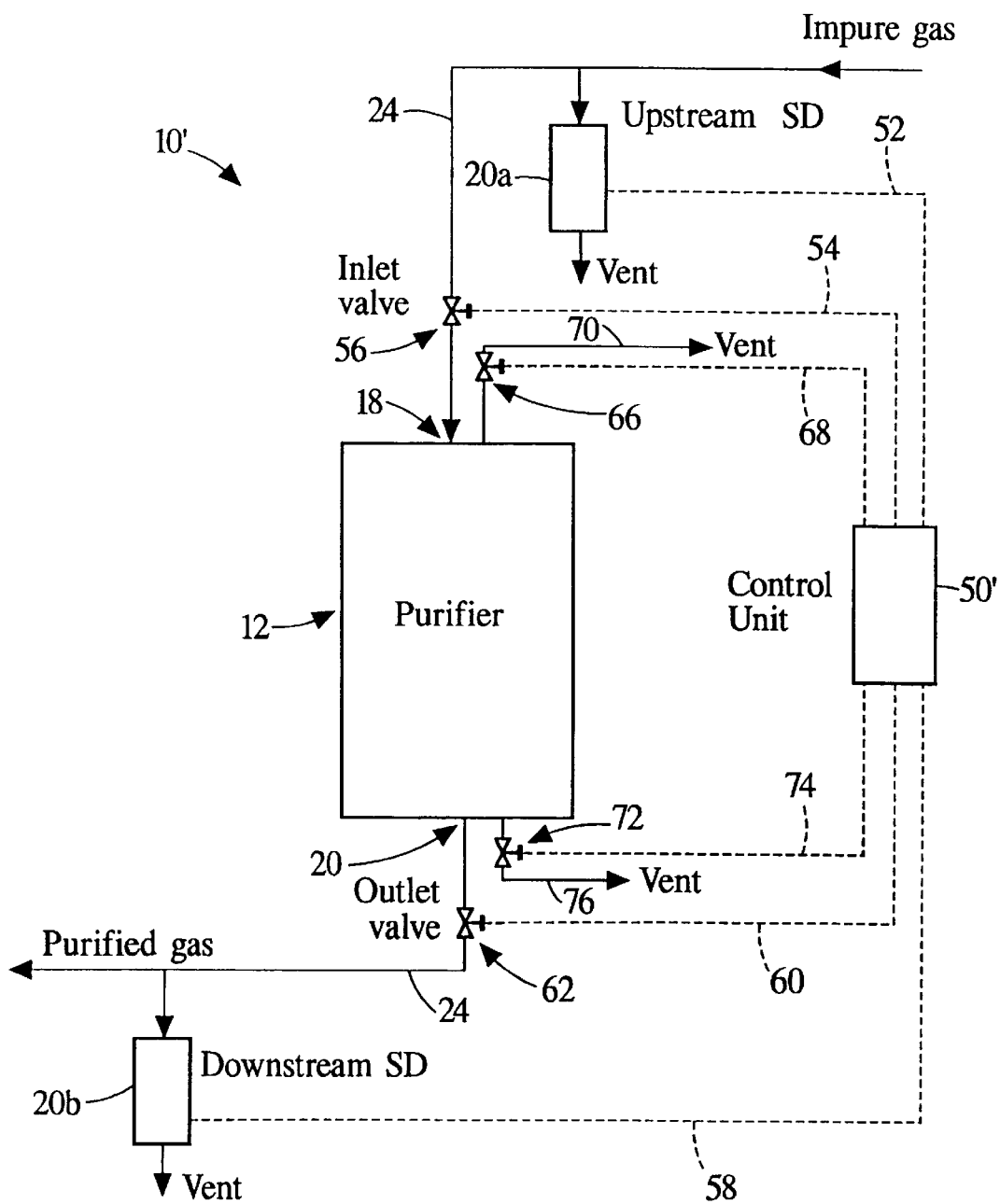
FIG. 5 is a block diagram of a different embodiment of the gas purifier and safety system of FIG. 4.

FIG. 5 is a schematic diagram of an alternate embodiment of the system 10' shown in FIG. 4. In FIG. 5, a control unit 50' provides an additional protection for purifier 12 by controlling venting of the purifier chamber.

As in FIG. 4, control unit 50' receives danger signals on lines 52 and 58 from system devices 20a and 20b, respectively, and outputs open/close signals on lines 54 and 60 to valves 56 and 62, respectively. In addition, control unit 50' can send an open or close signal to an inlet vent valve 66 via line 68 to open or close the valve. The vent valve is open, the gas in purifier 12 vents to the atmosphere through pipeline 70. Likewise, the control unit 50' can send an open or close signal to an outlet vent valve 72 via line 74 to open or close the valve, such that when the vent valve 72 is open, the gas in purifier 12 vents to the atmosphere through pipeline 76.

The vent valves 66 and 72 are used to expel most of the reactive gases from the body of the purifier 12 during an accident. For example, purifiers typically operate at about a constant pressure. During an emergency, the purifier is isolated by the closing of inlet valve 56 and outlet valve 62 by control unit 50'. Since the safety system operates to shut down the system during the very first seconds of the accident, the gas composition in the isolated purifier mostly consists of the impure gas to be purified at the purifier working pressure. Depending on the type of accident, the undesired high amount of reactive gas will enter from the inlet side or the outlet side. Thus, the critical zone of the purifier (the zone that reaches high temperatures) is either the zone near the inlet or near the outlet. By opening the vent valve closest to the reactive gas, the gas present in the purifier at superatmospheric pressure escapes the purifier body, washing the critical zone of the reactive gas. This has two effects: the critical zone is cooled due to heat removal by the gas flow; and the reactive gas is removed.

The vent valves 66 and 72 may be adjusted to a predetermined magnitude of pressure drop so as to assure that the outward flow of gas is stopped when the pressure inside the purifier vessel is higher than the atmospheric pressure, thereby assuring avoidance of backflow in the purifier body. Of course, operation of the vent valves may be avoided when the gas to be purified is dangerous (e.g., hydrogen that may explode if exposed to air at high temperature) or toxic (e.g., halogenated gases, ammonia, etc.). In alternate embodiments, the vent valves can be connected to the waste gas line, at the end of which are positioned scrubbers or other systems for abating dangerous gases. In all the system design embodiments described above, vent valves may be present at only one end (inlet or outlet) or at both ends of the purifier 12.

In addition, thermocouples can be positioned in the purifier near the inlet 18 and outlet 20 to sense the temperature of the critical zone. The control unit 50' can be coupled to the thermocouples and can sense which thermocouples detect the temperature change; thus, only the venting valve of the corresponding critical zone need be opened instead of both valves, thereby improving the efficiency of the safety system (because all of the outward flow passes through the critical zone).

Figure 6:
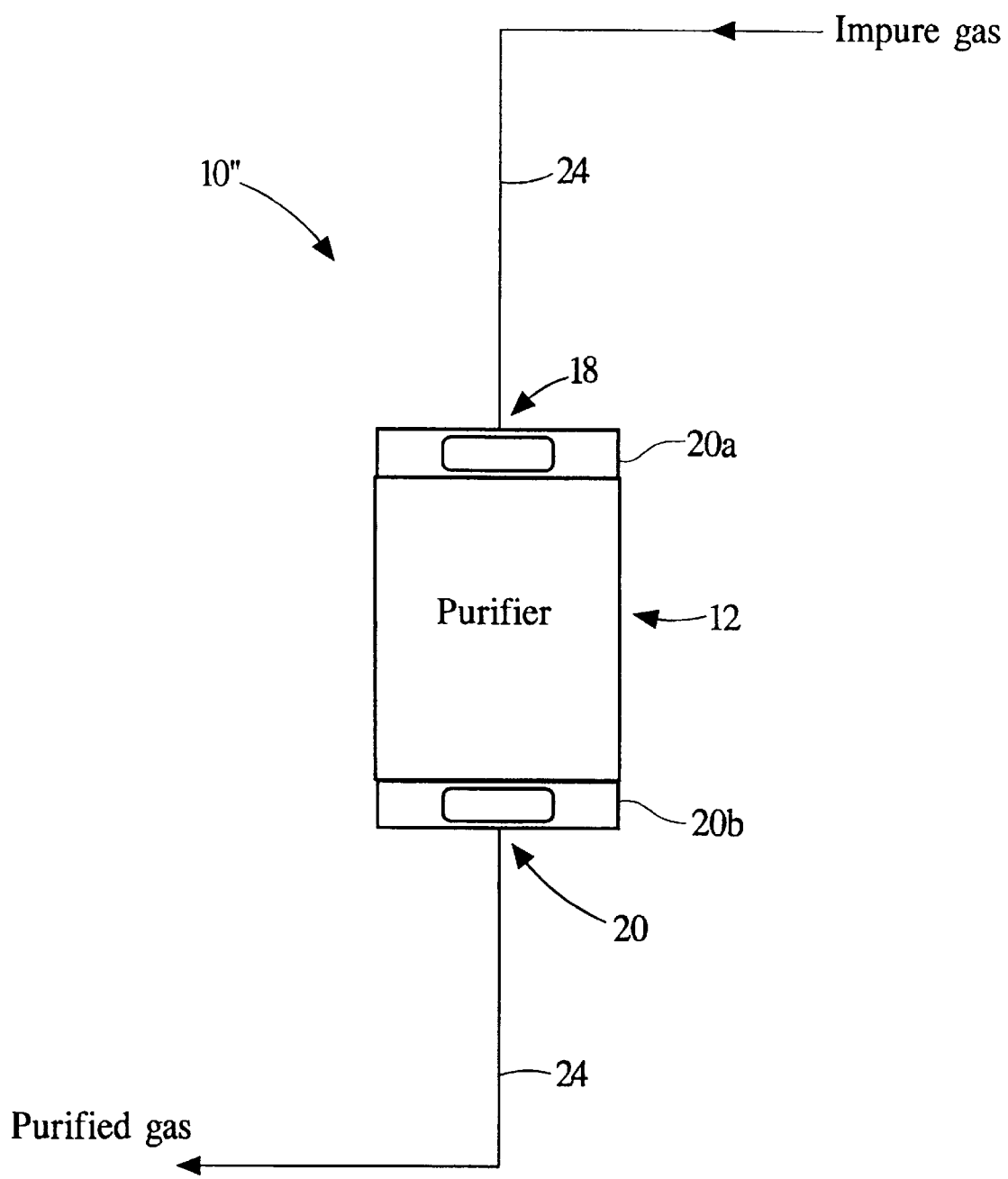
FIG. 6 is a block diagram of a fourth embodiment of a gas purifier and safety system of the present invention.

FIG. 6 is a schematic diagram of another alternate embodiment of the safety system of the present invention, in which a safety device is positioned in the end of the purifier 12. For example, safety device 20*a* can be positioned in the front end of the getter column purifier and senses the input gas before it reaches the getter materials in the purifier 12, similar to the embodiment of FIG. 1. If a high concentration of a reactive gas is detected, the gas flow is stopped or diverted as explained in the above embodiments. Likewise, a safety device 20*b* can be positioned at the back end of the purifier to detect backflow gases.

All of the different embodiments described above can be combined in various ways to achieve different structures of safety purifier systems. Thus, a wide variety of possible systems may be implemented according to the present invention.

Safety Devices

The safety devices 20*a* and 20*b* of the present invention can be implemented in a variety of ways. Some possible embodiments are described in detail below.

Cartridge of Getter Material

Figure 7:
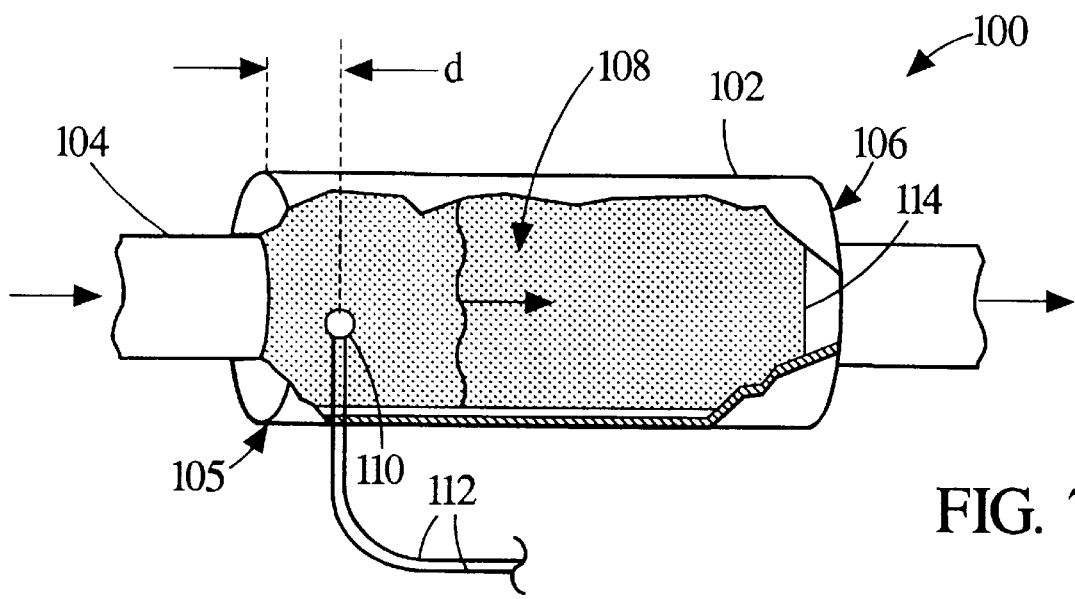
FIG. 7 is a diagrammatic illustration of a first embodiment of a safety device of the present invention.

FIG. 7 illustrates a cartridge embodiment 100 for implementing the safety devices 20*a* and 20*b*. A small cylinder 102 is provided with an inlet 104 and an outlet 106 and is made of a material capable of withstanding the working temperature of a getter material 108 positioned inside the cylinder, e.g., about 400° C. (the operating temperature of a safety device 20*a* or 20*b* can depend on the geometry of the getter material used and other parameters, such as flow rate of the gas through the safety device). The material of the cylinder is inert towards the getter at the operation temperature. The system device may be charged with a getter material different from the getter material in the purifier 12, but generally it is easier to employ the same getter material for both purifier and safety device. The safety device detects the temperature increase of the getter material caused by too high an amount of reactive gas reaching the getter material (which is, on a smaller scale, the same behavior of the purifier). The cylinder preferably is heated to the operating temperature, such as 350–400° C., e.g., using a coil heater or the like.

The reactive gases are impurities to be removed from a gas inert towards the getter material. During normal operation, the quantity of reactive gases per unit time that contact the getter is small enough to allow reaching a steady condition, where the heat generated by the reaction between gas and getter has time to be eliminated from the system. In these conditions, the temperature of the system is essentially the temperature imposed by an external heater (such as an external heater used in getter gas purifiers, which is also applicable to the other embodiments described herein). In an emergency, the situation is reversed, and the amount of reactive gas that reaches the getter per unit time is so high that reaction heat cannot be dissipated, leading to a rise of temperature of the safety device above the predetermined temperature.

It is thus possible to place a thermocouple 110 inside the safety device to sense this increase of temperature above the normal operation temperature. The thermocouple is positioned in getter material 108 at a distance d from the front edge 105 of the getter bed 108. Control unit 50 is preferably coupled to the thermocouple by line(s) 112. In order to avoid unnecessary stops of purifier operation, it is desirable to foresee the possibility of statistic fluctuations of temperature. To implement a safety device in accordance with this goal, it is desirable to define a threshold value of predetermined temperature T that must be overcome for the system to generate an alarm condition. In general, the purifier and safety device work at about 350–600° C., while the purifier walls may stand temperatures of at least 1000–1100° C.; thus, there is room for selecting a predetermined alarm temperature. This alarm temperature must, however, not be chosen at too high a value, since the reaction time of the safety device should be reduced as much as possible. As a rule of practice, the electronics or control unit 50 connected to the safety device may be preset to generate an alarm when the safety device thermocouple senses a temperature 50–100° C. higher than the purifier operation temperature. Tests presented below were conducted at the two alarm temperatures 50° C. or greater and 100° C. or greater.

The detailed structure of the safety device has been tested under preliminary studies. In order not to divert too much flow from the main pipeline 24 through the safety device, the inlet to the safety device is preferably small. Various diameters may be used; for example, the diameter of the opening can range from 1" to ⅜". In performed tests, a ½" diameter has proved to be preferred, especially when using getter powders having a grain size below 212 microns. Other sizes may be preferred if a different getter grain size is used.

The aging of the safety device 20 (especially device 20a) is a different major concern. During normal life, the safety device is exposed to the impure gas, and the getter material next to the inlet absorbs impurities and becomes spent (or nearly so). When this occurs, impurities travel into the safety device and react with a fresh part of getter material, and so on. A traveling front 114 (aging front) of fresh getter material is established that travels from the inlet 104 toward the outlet 106 of the safety device. In case of an accident, the reaction with excess of impurities takes place at the first fresh getter zone, that is, at the traveling aging front. The best positioning of the thermocouple 110 is at the reaction zone, but while the thermocouple is fixed, the reaction front moves with the aging front. With a fresh safety device, the best positioning of the thermocouple is as close as possible to the front of the getter bed (or other structure) in the safety device. For example, the thermocouple 110 can be positioned about 0.2 cm from the inlet to assure the thermocouple is embedded in the getter material. The goal life span of the safety device is six months. It has been determined that, with standard operating conditions, in six months the aging front travels about 0.7 cm into the getter bed. The getter bed positioned 0.2 cm from the inlet has been tested with a safety device that has been aged six months (at the end of its lifespan) and the alarm detection time was tripled from that of a new safety device. However, during the aging time, the purifier also becomes partially spent, and the reactivity of the getter material of the purifier thus decreases, such that a longer alarm time is sufficient at this later stage to avoid catastrophic events from a breach in containment. As a consequence, a fixed position at 0.2 cm from the safety device inlet is suitable for the thermocouple during the entire life of the safety device (d=0.2 cm). One suitable material for a thermocouple is Ni/NiCr, and the thermocouple includes two bare wires joined at the 0.2 cm position.

As for the form of the getter material in the safety device, powders are preferred compared to pills. Powdered getter materials typically allow a better uniformity of reactions involved in the detection mechanism. In addition, containment materials for the getter material preferably are stainless steel or glass. Glass has the added advantage in that it allows inspection of the proper positioning of the thermocouple through the transparent or partially-transparent containment walls.

The time of detection of dangerous levels of impurity gases is critical to determining whether an implementation of a safety device is adequate for the safety system of the present invention. Tests were performed with oxygen as the impurity gas. Any particular concentration of gas was tested in at least 3 measures (for all of the tests described below). The safety device was charged with fine powder getter material, such as St 707™, which has a grain size below 212 microns. The safety device was contacted with a flow of argon (Ar) containing oxygen at various percentages. The linear speed of gas flow was maintained at 18.5 cm/sec, which provides good flow conditions. The results of the tests are provided in Table 1 below. Column 2 lists the time required for the safety device to sense a temperature increase of 50° C. over the working temperature, and column 3 lists the time required for detecting a 100° C. increase.

TABLE 1

| Oxygen % in Argon | Response time, +50° C. (sec) | Response time, +100° C. (sec) |
|---|---|---|
| 1.00 | 40 | not reached |
| 1.00 | 53 | not reached |
| 2.00 | 29 | 65 |
| 2.00 | 12.5 | 21.5 |
| 2.00 | 15 | 30 |
| 3.00 | 8 | 10.5 |
| 3.00 | 10.5 | 17.5 |
| 3.00 | 14 | 17.5 |
| 10.00 | 7.5 | 9 |
| 10.00 | 8.5 | 11 |
| 10.00 | 7 | 10.5 |
| 20.00 | 5.5 | 7.5 |
| 20.00 | 3.5 | 4 |
| 20.00 | 3.5 | 4 |
| air | 2.5 | 3.5 |
| air | 2.5 | 3.5 |
| air | 2.5 | 3.5 |

The spread in results at constant oxygen percentage may be due to slight differences in thermocouple positioning.

To determine the critical time in which a safety device must act before the purifier is damaged, both actual tests were carried out on purifiers for some critical times and theoretical data was obtained for other critical times based on a model optimized by fitting the results of tests. For 1% oxygen in Argon, after 46.5 seconds of flow, it was determined that the purifier will reach a temperature of about 480° C. The forty-second response time for the safety device to react is thus sufficient for the system to shut down before critical temperatures are reached. The response time is sufficient for 1.5% oxygen in Ar as well.

For 2–3% oxygen in Argon, the time required for a purifier to reach critical temperatures (about 1000° C.) is about 25 seconds of flow. The safety device detects a +50° C. in less than 15 seconds, which allows safe operation of a purifier.

For 10% oxygen in Argon, the critical time of flow on the purifier getter mass is about 8 seconds. The safety device is capable of preventing disruption of the purifier if the control unit commands venting valves as well as shutting inlet and outlet valves to the purifier (as shown in FIG. 5).

For 20% oxygen in Argon, experimental results with a standard getter column showed that 3–5 seconds for the safety device to react is sufficient for protecting the purifier if the control unit commands venting valves as well as shutting inlet and outlet valves.

Air is different from the previous impurity gases in that a mixture of oxygen and nitrogen is provided, where nitrogen, unlike argon, is reactive toward certain getter materials such as St 707. This extra reactivity accounts for the lower reaction times shown in Table 1. However, tests have shown that the safety device is able to protect the purifier if the control unit commands both inlet-outlet and venting valves.

Another set of tests have been performed using a different getter material, St 198 instead of St 707. St 198 is used for purification of nitrogen at a working temperature of 350° C. Thus, the impure gas used was oxygen in nitrogen. The results are provided below in Table 2:

TABLE 2

| Oxygen % in Nitrogen | Response time, +50° C. (sec) |
| --- | --- |
| 3 | 18.5 |
| 10 | 6 |
| 20 | 5.4 |
| air | / |

The response times of St 198 and St 707, apart from statistical fluctuations, are similar. St 198 has with oxygen a less exothermic reaction compared to St 707, but when the temperature increases to over 400° C. (due to the reaction with oxygen), St 198 starts to sorb nitrogen as well, contributing to reaction heat and to lowering detection time.

Nitrogen present in a noble gas may destroy a purifier employing St 707 getter material. Tests were also performed to evaluate the possibility of protecting such a purifier from intake of different amounts of $N_2$ in Argon with the purifier maintained at 400° C. Table 3 provides the average results of these tests:

TABLE 3

| Nitrogen % in Argon | Response time, +50° C. (sec) |
| --- | --- |
| 6 | not reached |
| 10 | 14 |
| 14 | 15 |
| 20 | 10.1 |
| 100 (pure $N_2$) | 4.9 |

The 6% nitrogen concentration is not critical at all, as 450° C. is never reached. A test performed using a standard getter column shows that a purifier flowed with pure nitrogen reaches 650° C. after 6.5 seconds of flow. As the safety device reacts in 4.9 seconds in pure nitrogen, it is capable of effectively protecting the purifier. Since 6% is not a danger, and since the safety device may save the purifier from the most dangerous conditions, the times in table 3 are low enough for the safety device to save the purifier in all or almost all cases.

Getter Coated Strip

Figure 8:
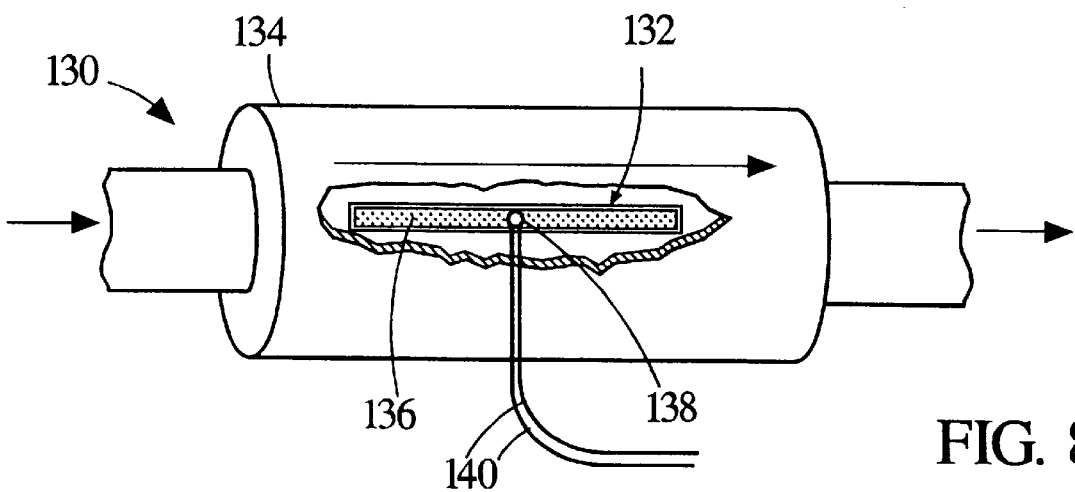
FIG. 8 is a diagrammatic illustration of a second embodiment of a safety device of the present invention.

FIG. 8 illustrates a second embodiment 130 of the safety devices 20a and 20b which includes a support strip of metal or substrate deposited with getter powders. A metallic strip 132 is placed in a cylinder 134 made, for example, from stainless steel. A getter material 136 can be screen printed on the support strip 132. Screen printing is described in co-pending patent application Ser. No. 08/855,080, hereby incorporated by reference herein. For example, a Nichrome foil 20 microns thick, 1 cm wide, and 10 cm long, can be screen print coated with St 122 getter powders. St 122 is a mechanical mixture of titanium powders and St 707 alloy powders. The thickness of getter powders deposit can vary between 70 and 200 microns (thus the dimensions of FIG. 8 are exaggerated). In other embodiments, other dimensions and materials can be used. For example, St 172, a mechanical mixture of St 707 and zirconium powders, may be used.

Alternatively, other methods can be used to deposit the getter material on the strip. For example, cold rolling can be used, as is well known to those skilled in the powders metallurgy arts; or spraying can be performed, as described in Patent Application publication WO95/23425, assigned to the assignee of the present application, and incorporated by reference herein. A thermocouple 138 is coupled to the metallic strip 132 and is coupled to the controller 50 by wires 140. The cylinder is preferably heated to an operating temperature, such as 500° C., e.g., using a coil heater or the like.

The principles of operation for this safety device are the same as for the above-described getter cartridge embodiment, i.e., the detection with a thermocouple of a 50° C. or 100° C. increase of temperature over the steady operation temperature of the safety device. The thermocouple 138 can be obtained by welding one Ni wire 140 and one NiCr wire 140 to the metallic support strip. As described herein, only oxygen detection is shown; however, conclusions based on oxygen tests can be easily extended to nitrogen and other gases as shown in the getter cartridge embodiment above.

Parameters described below include the oxygen concentration, the aging of the safety device, the shape of the safety device (flat or bent), the operating temperature, and the thickness of the getter powder deposit on the support strip.

In one embodiment, the coated support strip is placed in a stainless steel cylinder, 1" diameter, 5" long. In this embodiment, the support strip is flat (not bent) and positioned parallel to the direction of gas flow. The safety device is initially conditioned by activating the getter at about 400–500° C. under 300 cc/min of pure Argon for about 30 minutes.

The effect of oxygen concentration on the response time of the safety device is summarized in Table 4 below as resulting from performed tests. The safety device was maintained at 400–500° C. and exposed to various oxygen concentrations in argon (flow constant at 1000 cc/min). A fresh, uncontaminated safety device was used for each test. A screen printing technique was used to deposit the getter materials on the strip.

TABLE 4

| Operating T (° C.) | Oxygen % | Response time, +50° C. | Response time, +100° C. | Max T (° C.) |
| --- | --- | --- | --- | --- |
| 400 | 1 | / | / | 422 |
| 500 | 1 | 1<t<2 | 1<t<2 | 703 |
| 500 | 10 | 1<t<2 | 1<t<2 | 784 |
| 500 | 50 | 1<t<2 | 1<t<2 | 1154 |

It should be noted that, while at 400° C. the device does not operate properly, at 500° C. the response time is extremely fast at all oxygen concentrations, so the device in preventing damage to the purifier.

The effect of aging on the safety device was determined by testing devices after accelerated aging. In one result, there was almost no aging effect with a 50% oxygen conception, for which the +100° C. response time becomes 3–4 seconds to be compared with 1–2 seconds for a fresh safety device. The difference is more noticeable when diluted impurities (1%) are to be detected: in one test, the +50° C. situation was never reached, with a maximum temperature increase of 22° C. occurring.

The geometry of the support strip may also affect the overall temperature in the current embodiment. A bent strip typically has a higher overall temperature increase compared to a straight strip, since heat removal has a lower effect on a bent strip. However, a "shadow" effect occurs, where different parts of the bent strip hinder gas conduction on other parts of the same strip. The balance of these opposite effects is that at 50% oxygen, a bent strip reacts faster and to a greater extent than a straight strip, and may also possibly reach a point where the strip melts. However, at 10% oxygen or lower, an increase in detection time, from 1–2 to 4–7 seconds, may occur.

The effect of temperature on the reaction time of the safety device has been described in connection with the effect of oxygen concentration. It should be noted that, in low oxygen concentration detection, aging acts on the temperature parameter so as to hide the difference of behavior between 400 and 500° C.

The thickness of the getter deposit 136 on the support strip may also affect the operation of the safety device. Comparative tests have been conducted at 500° C., 1000 cc/min overall flow, 10% oxygen in argon, to evaluate the effect of deposit thickness. The result is that a 70 micron deposit safety device detects a +50° C. increase faster (1–2 seconds) than a 200 micron deposit safety device (2–4 seconds).

As a result of the above, the preferred, optimal operating condition for this safety device can be described to be at about 500° C., with a getter deposit thickness of 70 microns. It may be preferable to use a straight support strip rather than a bent strip, since the straight strip allows a faster detection time at low impurity concentrations, which is the most critical condition for safety device operation. It should be noted that the tested conditions described above provide a working safety device; however, several optimal combinations of these parameters may be found through systematic tests. Only one of these "best result" sets of conditions is described herein.

Metallic Hot Filament

Figure 9:
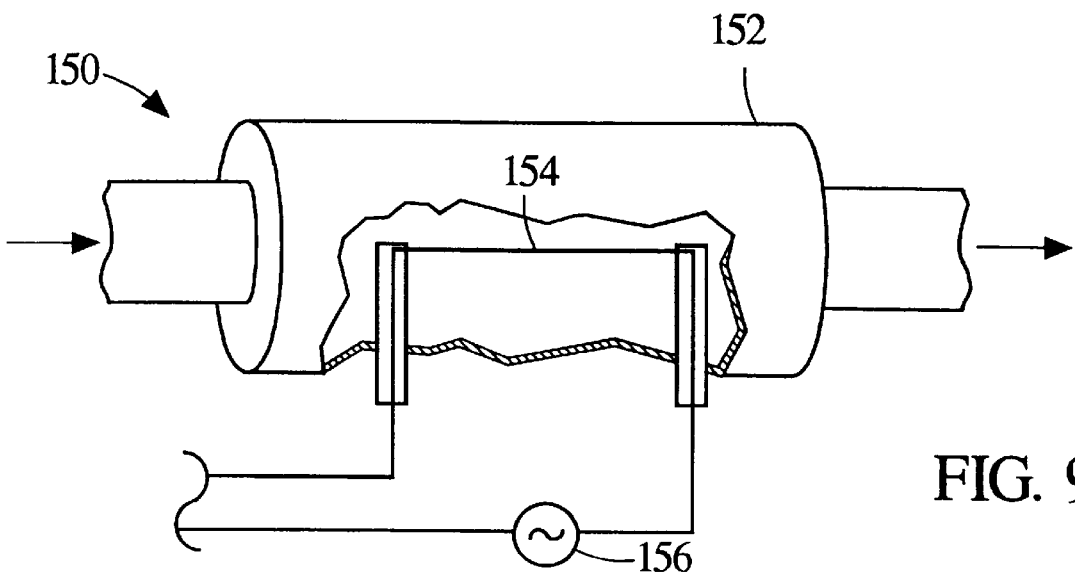
FIG. 9 is a diagrammatic illustration of a third embodiment of a safety device of the present invention.

FIG. 9 illustrates a third embodiment 150 of the safety device 20a and 20b described herein which includes a metallic filament installed in a cylinder with feedthrough for current. Cylinder 152 holds metallic filament 154, which is coupled to a current source 156. Control unit 50 or 50' included in the circuit. For example, a glass cylinder can be used having an internal diameter of 30 mm and a length of 230 mm; however, such dimensions can be varied in other embodiments. The operation principle is that a hot filament in presence of a reactive gas breaks, very similar to what occurs in incandescent lamps, which interrupts the electrical circuit. The breaking of the circuit is read by the control unit 50 or 50' as the alarm signal.

In one test, the metal tungsten (W) was tested. Tungsten is reactive towards oxygen and water (that simply acts as an oxygen reservoir in this case), only while these gases are not present with nitrogen and hydrogen. Thus, tungsten can be used to detect the presence of oxygen or water in the purification of noble gases, as well as nitrogen and hydrogen.

The safety device can be conditioned by flowing pure argon through it at room temperature for at least five minutes to remove possible contaminants. The filament is then heated by passing electricity through it. Tests were carried out by flowing argon in the safety device containing different concentrations of oxygen, and evaluating the time needed to break the filament and provide the alarm signal. The safety devices were tested with 1% and 10% oxygen in argon. The results depend on filament diameter, applied voltage, and overall gas flow. In particular, for a given impurity concentration, the time to break the filament (detection time of the safety device) increases as the filament diameter increases, the applied voltage (and thus the filament temperature) decreases, and the overall gas flow decreases.

A series of tests have been performed using an oxygen impurity in argon as the test gas. The tests were performed according to a matrix scheme, in which any parameter under evaluation was varied while keeping the other parameter constant. Specifically, total gas flow was varied between 200 and 1000 cc/min; oxygen concentration was varied between 1 and 10%; voltage applied to the filament was varied between 8 and 220 V; and filament diameter was varied between 0.05 and 0.2 millimeters. The lowest breakage time, about 2 seconds, was obtained at 900 cc/min, 10% oxygen, 24 V and filament diameter 0.05 mm, while the longest breakage time, about 80 seconds, was obtained at 1000 cc/min, 1% oxygen, 8 V and filament diameter 0.2 mm. These results indicate a fast, highly responsive device; however, the reaction time may be modulated to obtain a longer responsiveness, e.g. a longer lifespan device.

Thus, the metallic filaments of the present invention perform quite well as fast response safety devices for the safety system of the present invention. However, the metallic filament devices have a drawback of a relatively short life, compared to the other embodiments of the safety devices, if exposed to impure gas. Therefore, the metallic filament devices are best suited for use as downstream safety devices 20b, since at this position they have an adequate lifespan due to receiving only high purity gas after it has left the purifier 12, and also have a fast response in case of backflow into the purifier.

Getter Fuse

A getter "fuse" safety device embodiment of the present invention is similar to the metallic filament embodiment described above. A metallic substrate or strip is deposited with a getter material to create a getter "fuse." For example, a stainless steel ribbon can be coated with a getter material, e.g. the getter material can be screen printed, cold rolled, sprayed, etc. on the stainless steel similarly to these techniques in the getter coated strip embodiment, as described above. The getter coated metallic strip can be provided in place of filament 154 in the cylinder and electrical circuit of FIG. 9. The cylinder is preferably heated to an operating temperature with a heater, such as 500–600° C. When a high concentration of an impure gas enters the cylinder, a reaction takes place between the reactive gas and the getter material, and the metallic ribbon melts, thus breaking the circuit and indicating the alarm condition similarly to the metallic filament described above. This embodiment differs from the getter coated strip described above in that the above embodiment uses thermocouples to detect an alarm temperature, while the current embodiment simply breaks a circuit to indicate an alarm condition.

Figure 10:
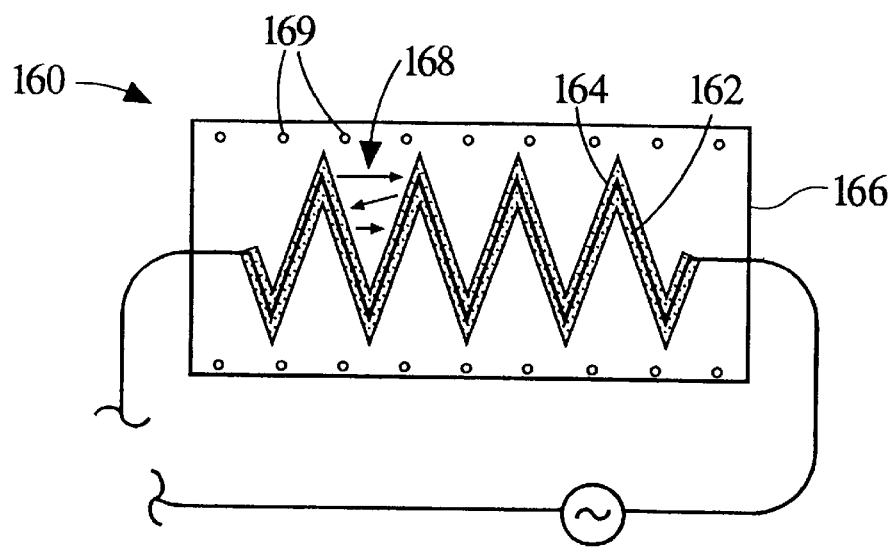
FIG. 10 is a diagrammatic illustration of a fourth embodiment of a safety device of the present invention.

FIG. 10 illustrates another embodiment 160 of a getter fuse of the present invention that can be used in a safety device 20a or 20b. One problem with using a flat or even slightly bent getter-coated strip as a getter fuse is that a large amount of heat escapes from the getter strip, thus requiring a high amount of heat in the cylinder to allow the reaction between the impure gas and the getter material to occur. In FIG. 10, a "concertina" shaped metallic strip 162 is screen printed with a getter material 164 similarly to the embodiments above. For example, a straight strip can be coated with the getter material, and then the strip is bent into the configuration shown. The coated strip 162 is placed in a chamber 166 such as a cylinder. As with the straight getter fuse, when the getter material 164 reacts with a high concentration of impure gas, then the reaction causes the strip 162 to burn through and a break in an electrical connection is made. This break is detected as an alarm signal to indicate the presence of the high concentration of impure gas.

The concertina shaped strip allows a faster reaction between impure gas and getter material to occur since heat is not allowed to be wasted. For example, as shown by arrows 168, the heat escaping from one portion of the strip 162 is radiated onto a different portion of the strip, so that heat radiating from different portions is amplified to cause a faster reaction on adjacent portions of the strip. This causes the metallic strip 162 to melt faster than a straight metallic strip embodiment, and thus reduces the reaction time of the safety device. In other embodiments, other types of shapes can be implemented; for example, a square or rounded concertina shape can be provided.

In addition, a radiation shield is preferably placed around the getter coated strip 162 to reflect heat that travels away from the strip back towards the strip. For example, a tubular radiation shield 169 is shown in FIG. 10 which includes a lurality of tubes set against the walls of the cylinder or chamber (there is also preferably an external heater included in the chamber to heat up the chamber to the operating temperature). The other embodiments of safety devices described herein, such as the flat or bent strip, may also include a radiation shield such as the tubular radiation shield 169. Alternatively, the chamber or cylinder walls can be made of or coated with a material to cause efficient reflection of heat.

Wire Under Tension

Figure 11:
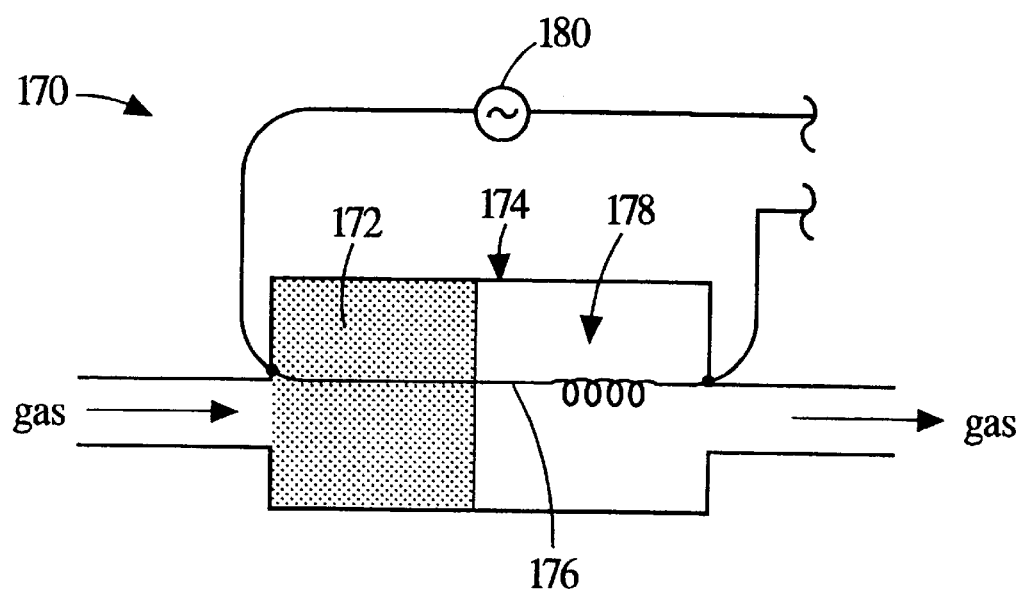
FIG. 11 is a diagrammatic illustration of a fifth embodiment of a safety device of the present invention.

FIG. 11 illustrates another embodiment 170 of a safety device 20a or 20b, in which a spring-tensioned wire in getter material indicates an alarm condition. Getter material or bed 172 is provided in a container 174 through which the gas is flowed. An operating temperature of 400–500° C. or so can be provided in the container. A filament or wire 176 is provided through the getter bed 172 and is coupled to a spring 178, which is coupled to the other end of the container. A current source 180 is provided to flow electrical current through the wire, as in FIG. 9. For example, the wire can be stainless steel or aluminum. When the getter reacts with a high concentration of impure gas, the wire melts or breaks at a certain known temperature, and the tension of spring 178 breaks the wire to ensure that no current will flow. The break in current flow is detected by the control unit as an alarm condition. For example, if the wire 176 is aluminum, the getter bed can get to 600° C. (or a eutectic condition) before breaking; or, if the wire is stainless steel, the getter bed can get to 1000° C. (or eutectic) before the current flow is broken.

Differential Sensor

Figure 12A:
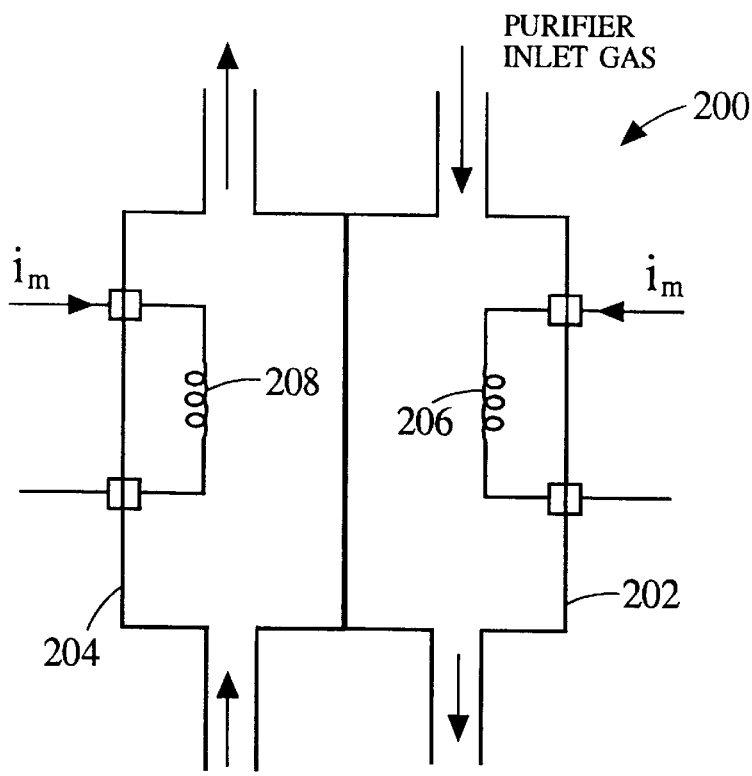
FIGS. 12a and 12b are diagrammatic illustrations of a sixth embodiment of a safety device of the present invention.
Figure 12B:
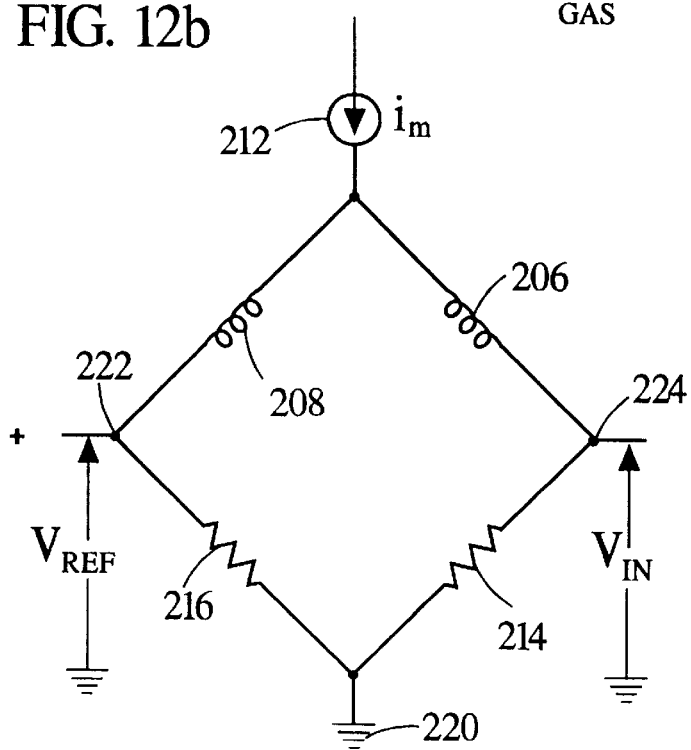

FIGS. 12a and 12b illustrate another embodiment 200 of a safety device 20a or 20b, in which a differential thermal conductivity sensor is used to determine an alarm condition. In FIG. 12a, a chamber 202 includes a measurement thermal conductivity filament 206 that changes in conductivity depending on the concentration of impure gas in the gas flowed through the chamber 202. The input gas going into the inlet of the purifier 12 is flowed through chamber 202. Electric current $i_m$ is flowed through the filament 206. A second chamber 204 includes a similar reference thermal conductivity filament 208 through which current $i_m$ is flowed. The outlet gas from purifier 12 is flowed through the chamber 204.

FIG. 12b illustrates the circuit that senses the impure concentrations in the flowed gas. Current $i_m$ from a current source 212 is divided to flow through each filament 206 and 208. Resistors 214 and 216 are provided between the filaments 206 and 208, respectively, and ground 220. A reference voltage $V_{REF}$ is measured between the node 222 and ground, and a voltage $V_M$ is measured between the node 224 and ground. The difference between these voltages should be small if low concentrations of impure gas are flowed through the chamber 202, since the thermal conductivity of the filaments 206 and 208 will not be much different and thus the current $i_m$ and the voltages will not be much different. However, if a high concentration of impure gas is flowed through chamber 202, it will differ from the impure gas concentration in the purified gas through chamber 204 by a large margin, thus causing a large difference in the measured voltages $V_{REF}$ and $V_M$. Thus, when a difference above a predetermined threshold exists between the measured voltages and is detected by the control unit 50, an alarm condition has occurred. One issue with this embodiment is that the device is more complex than the previous embodiments, and thus issues of reliability and cost are raised.

While this invention has been described in terms of several preferred embodiments, there are alterations, permutations, and equivalents which fall within the scope of this invention. It should also be noted that there are many ways of implementing the methods and devices of the present invention.

What is claimed is:

1. A method for safely purifying gases comprising:
   providing a source of unpurified gas;
   passing said unpurified gas through a first safety device capable of developing an alarm signal when certain gas contaminants within said first safety device are above a given concentration level over a period of time;
   passing said unpurified gas through a gas purification unit that includes a purification material to provide a purified gas, where said purification material exhibits an exothermic reaction when exposed to said certain gas contaminants; and
   passing said purified gas through a second safety device capable of developing an alarm signal when said certain gas contaminants within said second safety device are above said given concentration level over said period of time.

2. A method for safely purifying gases as recited in claim 1 wherein at least one of a first valve situated between said source of unpurified gas and said first safety device and a second valve situated between said gas purification unit and said second safety device is closed upon the generation of said alarm signal.

3. A gas purification system with safety device comprising:
   a gas purification unit including an enclosure and a purification material disposed within said enclosure that exhibits an exothermic reaction when exposed to certain gas contaminants which may be present within said enclosure, said gas purification unit having an inlet coupled to an unpurified gas input line and an outlet coupled to a purified gas output line;
   a safety device coupled to one of said unpurified gas input line and said purified output line, where said safety device develops an alarm signal when gas contaminants within said safety device that are similar to said certain gas contaminants within said gas purification unit are above a given concentration level over a period of time; and
   wherein said safety device includes a detection material that is a getter material and a thermocouple for detecting a temperature of said getter material.

4. A gas purification system with safety device as recited in claim 3 wherein said getter material is a powder.

5. A gas purification system with safety device as recited in claim 3 wherein said getter material is applied to a substrate.

6. A gas purification system with safety device as recited in claim 3 wherein said safety device includes a filament which can melt when said certain gas contaminants are above said predetermined concentration levels.

7. A gas purification system with safety device as recited in claim 6 wherein said filament is under tension.

8. A gas purification system with safety device comprising:
- a gas purification unit including an enclosure and a purification material disposed within said enclosure that exhibits an exothermic reaction when exposed to certain gas contaminants which may be present within said enclosure, said gas purification unit having an inlet coupled to an unpurified gas input line and an outlet coupled to a purified gas output line;
- a first safety device coupled to said unpurified gas input line, wherein said safety device develops an alarm signal when gas contaminants within said safety device that are similar to said certain gas contaminants within said gas purification unit are above a given concentration level over a period of time; and
- a second safety device coupled to said purified gas output line.

9. A gas purification system with safety device as recited in claim 8 wherein said safety device determines that said certain gas contaminants are present above a predetermined concentration level by an exothermic reaction between said certain gas contaminant and a detection material.

10. A gas purification system with safety device as recited in claim 9 wherein said detection material is of the same type as said purification material.

11. A gas purification system with safety device as recited in claim 8 wherein said first safety device is coupled in series with said unpurified gas input line and said second safety device is coupled in series with said purified output line.

12. A gas purification system with safety device as recited in claim 8 wherein said first safety device is coupled in parallel with said unpurified gas input line and said second safety device is coupled in parallel with said purified output line.

13. A gas purification system with safety device as recited in claim 8 wherein said first safety device is tapped into said unpurified gas input line and said second safety device is tapped into said purified output line.

14. gas purification system with safety device as recited in claim 8 further comprising an automated valve which closes in response to said alarm signal to prevent gas from flowing into said gas purification unit.

15. A gas purification system with safety device as recited in claim 8 wherein said first and second safety devices each include a detection material that is a getter material and each said safety device further includes a thermocouple for detecting the temperature of said getter material.

16. A gas purification system with safety device as recited in claim 15 wherein said getter material is a powdered getter material.

17. A gas purification system with safety device as recited in claim 15 wherein said getter material is applied to a substrate.

18. A gas purification system with safety device as recited in claim 8 wherein each said safety device includes a filament which can melt when said certain gas contaminants are above said predetermined concentration levels.

19. A gas purification system with safety device as recited in claim 18 wherein aid filament is under tension.

* * * * *

UNITED STATES PATENT AND TRADEMARK OFFICE
CERTIFICATE OF CORRECTION

PATENT NO.   : 6,168,645 B1
DATED        : January 2, 2001
INVENTOR(S)  : Succi et al.

It is certified that error appears in the above-identified patent and that said Letters Patent is hereby corrected as shown below:

<u>Column 3,</u>
Line 10, reads: "now be described in tail with reference to the accompanying", it should read: -- now be described in detail with reference to the accompanying --;

<u>Column 12,</u>
Line 47, reads: "extremely fast at all oxygen concentrations, so the device in", it should read: -- extremely fast at all oxygen concentrations, so the device will be effective in --;
Line 53, reads: "conception, for which the +100 C. response time becomes", it should read" -- concentration, for which the +100 C. response time becomes --;

<u>Column 14,</u>
Line 62, reads: "strip 162 to bum through and a break in an electrical", it should read: -- strip 162 to burn through and a break in an electrical --;

<u>Column 15,</u>
Line 15, reads: "lurality of tubes set against the walls of the cylinder or", it should read: -- plurality of tubes set against the walls of the cylinder or --;

<u>Column 18,</u>
Line 32, reads: "in claim 18 wherein aid filament is under tension", it should read: -- in claim 18 wherein said filament is under tension --

Signed and Sealed this

Fourth Day of June, 2002

*Attest:*

JAMES E. ROGAN
*Attesting Officer*      *Director of the United States Patent and Trademark Office*